United States Patent [19]

Imaizumi

[11] Patent Number: 4,942,341

[45] Date of Patent: Jul. 17, 1990

[54] VERTICAL RAMP GENERATOR

[75] Inventor: Norio Imaizumi, Ota, Japan

[73] Assignee: Sanyo Electric Co., Ltd., Moriguchi, Japan

[21] Appl. No.: 363,830

[22] Filed: Jun. 9, 1989

[30] Foreign Application Priority Data

Jun. 20, 1988 [JP] Japan ................... 63-151767

[51] Int. Cl.⁵ ..................... H01J 29/70; H01J 29/76
[52] U.S. Cl. .................................................. 315/403
[58] Field of Search ................ 315/408, 403; 328/183

[56] References Cited

U.S. PATENT DOCUMENTS 4,339,669  7/1982  Jarrett et al. .................... 328/183
4,728,813  3/1988  Diller ............................... 328/183

Primary Examiner—Theodore M. Blum
Attorney, Agent, or Firm—Armstrong, Nikaido, Marmelstein, Kubovcik & Murray

[57] ABSTRACT

An object of the present invention is to provide a ramp generator which makes the scan start level by the sawtooth constant so as to obtain a proper interlace characteristic on the television picture plane. The present invention includes a clamping circuit which prevents the voltage from rising or falling so that a predetermined voltage value varies corresponding to the supply voltage.

4 Claims, 9 Drawing Sheets

VERTICAL PULSE
PRIOR ART

DIFFERENTIATING
CIRCUIT (58) OUTPUT

RF-FF (60)
Q OUTPUT

VOLTAGE AT
THE NODE A

PRIOR ART
FIG. 4
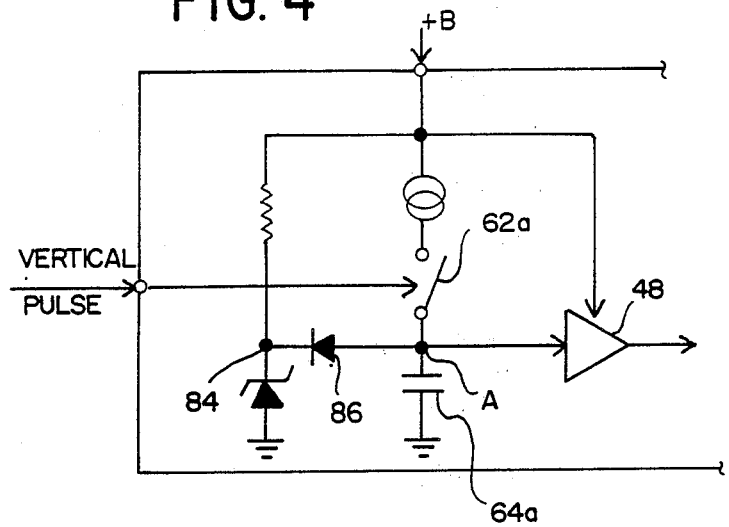
PRIOR ART
FIG. 5A
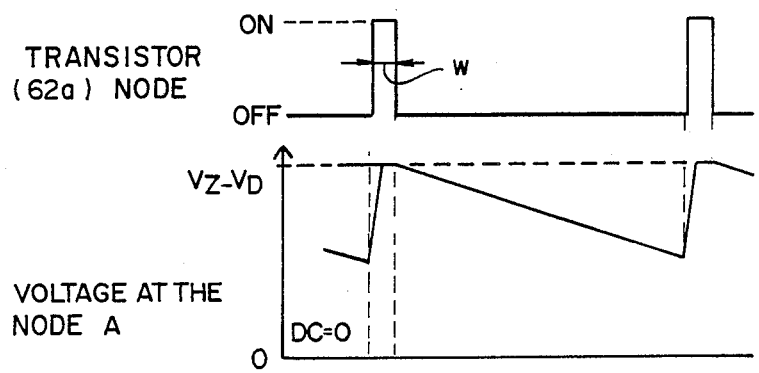
FIG. 5B

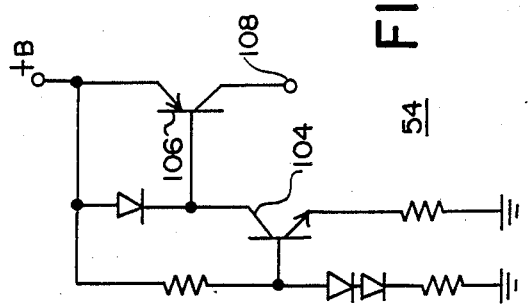
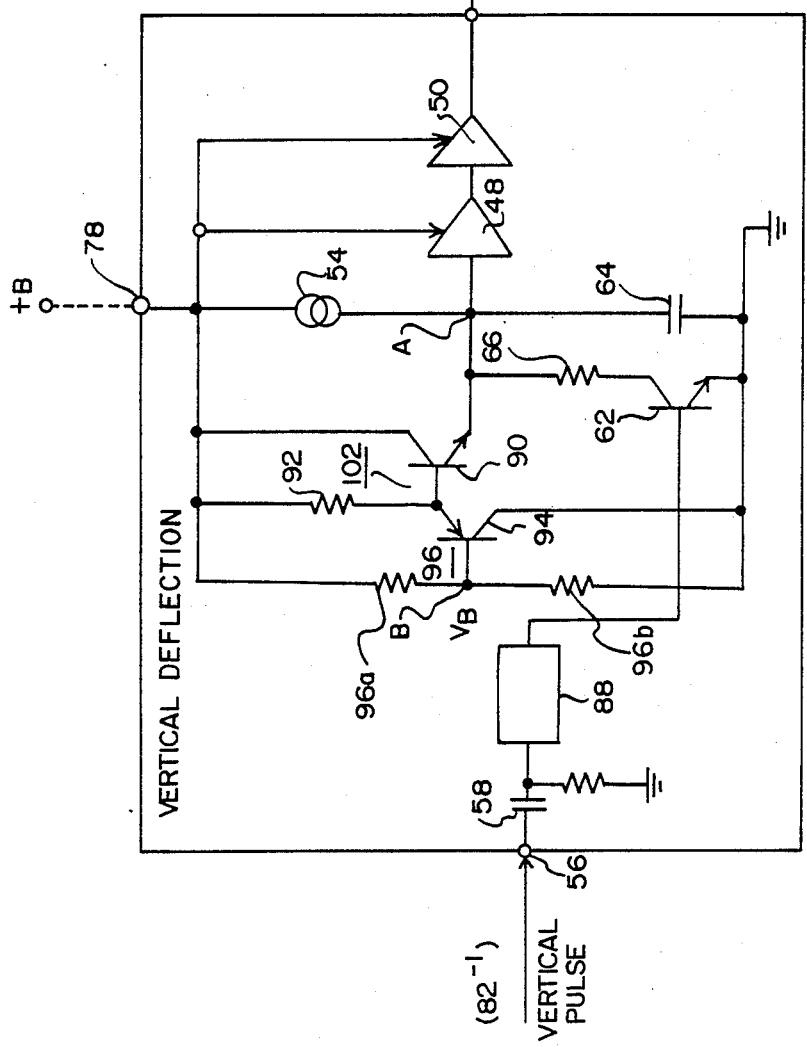

 FIG.8A VERTICAL PULSE
 FIG.8B DIFFERENTIATING CIRCUIT(58) OUTPUT
 FIG.8C MONOMULTI(88) OUTPUT
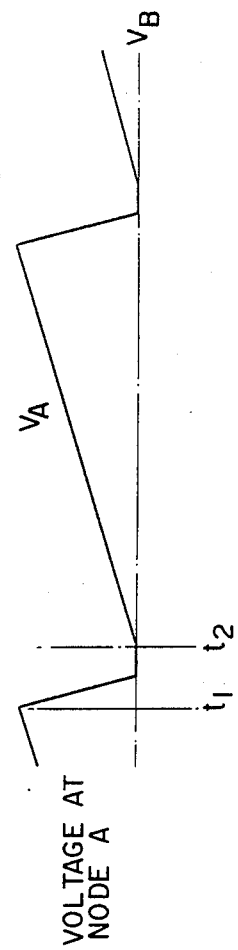 FIG.8D VOLTAGE AT NODE A

VERTICAL RAMP GENERATOR

FIELD OF THE INVENTION

The present invention relates to a ramp generator of a vertical deflection circuit in a television receiver, and more particularly, to an improvement in a ramp generator of a vertical deflection circuit provided with a clamping circuit in order to obtain a sawtooth wave of constant amplitude.

BACKGROUND OF THE INVENTION

An example of the conventional vertical deflection circuit is discussed below with reference to FIG. 1.

In FIG. 1, (10) is a video signal input terminal, (12) is a luminance chrominance signal processing circuit (Y/C processing circuit), (14) is a synchronous separator circuit, (16) is a vertical synchronizing signal separator circuit, and (18) is a vertical count-down circuit.

A horizontal AFC circuit (22) comprises a phase comparator (24), a low-pass filter (26), a voltage control oscillator (28) oscillating at the frequency two-fold of the horizontal frequency, and a 1/2 frequency divider (30).

In addition, the vertical count-down circuit has been described in U.S. Pat. No. 4,231,060 and European Patent No. 249,987 A2.

(32) is a vertical deflection circuit, (34) is a horizontal deflection circuit, (36) is a flyback transformer, (38) is a Braun tube (cathode ray tube), (40) is a horizontal deflection coil, (2) is a vertical deflection coil, and (44) is an anode electrode of the cathode ray tube (38).

At the vertical deflection circuit (32), (46) is a ramp generator, (48) is an amplifier circuit, and (50) is an electric power amplifier circuit.

(52) is a rectifier circuit for detecting voltage variation and for supplying supply voltage to the vertical deflection circuit. In other words, conventionally, it is known that anode voltage of the cathode ray tube (38) changes raster dimension at the cathode ray tube (refer to, for example, U.S. Pat. No. 4,298,829 and U.S. Pat. No. 4,752,722). Therefore, the rectifier circuit (52) detects the variation in anode voltage by rectifying the secondary winding (36a) of the flyback transformer (36). The output (+B) of the rectifier circuit (52) drives the vertical deflection circuit (32) and corrects the vertical deflection output so as not to change the raster dimension. The correction of vertical deflection output in FIG. changes a current value of the constant current circuit (54) at the ramp generator (46) to correct a slope angle of the sawtooth wave.

The video signal input from the video signal input terminal (10) includes a reproduction signal from a video cassette recorder (VCR). During the picture search reproduction and still reproduction of the VCR, the horizontal synchronization of the video signal input from the video signal input terminal (10) may be disturbed. Also simultaneously, the cycle period of vertical synchronization may expand or contract per one cycle period to thereby disturb the vertical synchronization.

In other words, during the reproduction of the VCR, the horizontal synchronizing signal disturbs, whereby the horizontal AFC circuit (22) is unstable. Hence, there is a problem that a pulse width of the vertical pulse output from the vertical countdown circuit (18) which counts the output to form the vertical pulse may vary. Also, during the VCR reproduction, the cycle period of vertical synchronizing signal expands or contracts, whereby there is a problem that the cycle period of the vertical pulse expands or contracts.

Therefore, the amplitude of the sawtooth wave signal from the ramp generator (46) varies, so that the picture of cathode ray 10 tube (38) may longitudinally deflect.

Hence, a vertical deflection circuit, which has a constant amplitude for a sawtooth signal also during the VCR reproduction, has been disclosed in the Japanese Utility Laid-Open Gazette No. SHO 63-12971.

FIG. 2 is a circuit diagram of the vertical deflection circuit (32a). FIG. 3 shows waveforms of the respective components. The vertical pulse (FIG. 3(a)) from the input terminal (56) becomes a signal in FIG. 3(b) through a differentiating circuit (58) and is applied to the set input S of RS-FF (RS type flip-flop circuit) (60) to set the RS-FF (60). Then, as shown in FIG. 3(c), its Q output is at a high level "H", thereby turning on the control transistor (62) (at time t1 in FIG. 3).

Upon turning on the control transistor (62), as shown in FIG. 3(d), a capacitor (64) charged by a constant current circuit (54) starts to discharge, the discharge current flows through a resistance (66) and the collector—the emitter transistor (62). When voltage (VA) at node A of the upper end of the capacitor (64) falls to be lower than voltage (VB) at node B (the time t2 in FIG. 3), a transistor (70) constituting a comparator (68) is off and a transistor (72) is on.

Therefore, transistors (74) and (76) are on to reset the RS-FF (60).

Then, the Q output of RS-FF (60) is inverted to be at a "L" level, whereby the control transistor (62) is on. Hence, the capacitor (64) is charged corresponding to the constant current circuit (54) and thereafter the same operation as the above will be repeated.

The vertical deflection circuit, which is constant in amplitude, stops discharge from the capacitor (64) when the level of the sawtooth wave signal is a predetermined value during the discharge of capacitor (64). In other words, the comparator (68) detects that the level of sawtooth wave signal becomes the predetermined value to thereby inhibit the pulse input to the discharge control transistor (62).

As the result, the sawtooth wave of constant amplitude is generated at node A, amplified by the amplifier circuits (48) and (50), and thereafter supplied as the deflecting current to the vertical deflection coil (42).

However, in the circuit in FIG. 2, the charge starting timing of capacitor (64) is decided by use of the differential comparator (68). Reference voltage (voltage VB at node B) of comparator (68) is obtained by resistive-dividing supply voltage (+B) of power source terminal (78) by resistances (80) and (82), but the supply voltage is obtained by smoothening the horizontal flyback pulse, whereby a ripple noise for a horizontal cycle period, even a little, remains in the dc component. Therefore, voltage at node B will vary for the horizontal cycle period.

The ripple noise of the reference voltage (voltage at node B) causes the comparator (68) to malfunction and the RS-FF (60) may be inverted to turn off the control transistor (62). Thus, in the circuit in FIG. 2, the ripple noise changes before and after the charge starting timing, thereby creating a problem in that the amplitude of the sawtooth wave signal varies.

As the result, the amplitude of the sawtooth wave is not continuous so that the vertical interlace characteristic on the television picture plane will be deteriorated. If the vertical pulse is not fluctuated in pulse width but the cycle period of the vertical pulse only expands or contracts, it is considered that a clamping circuit is housed in the ramp generator.

The ramp generator housing therein the clamping circuit is shown in FIG. 4. In addition, in the FIG. 4 example, a control transistor (62a) is on to charge a capacitor (64a). Its waveform is shown in FIG. 5.

In FIG. 4, (84) a reference voltage generator circuit, which comprises a Zener diode of Zener voltage Vz, and (86) is an anti-reverse-current diode and its forward voltage is VD.

For the circuit in FIG. 4, the scanning start level of sawtooth wave signal, as shown in FIG. 5(b), is fixed to clamping voltage (VZ-VD) so as to stabilize the scanning.

In the circuit in FIG. 4, however, when the vertical pulse varies in width (W in FIG. 5), the discharge start timing also varies, thereby creating the problem that the amplitude of the sawtooth wave signal varies.

Moreover, as described in FIG. 1, supply voltage (+B) of vertical deflection circuit is generated by rectifying the horizontal flyback signal directly or indirectly by the rectifier circuit ((52) in FIG. 1). Therefore rising of the voltage, when the power source is on, is late. Hence, as shown in FIG. 6, when the sawtooth wave signal on rising exceeds the clamping voltage (VZ-VD), the sawtooth signal is clamped and the amplitude (L in FIG. 6) of the sawtooth wave signal does not vary continuously (T in FIG. 6).

SUMMARY OF THE PRESENT INVENTION

An object of the present invention is to provide a ramp generator which makes the scan start level by the sawtooth constant so as to obtain a proper interlace characteristic on the television picture plane.

Another object of the invention is to provide a ramp generator, in which, when the power source is on, the amplitude of the sawtooth wave signal does not largely vary and is not continuous.

A further object of the invention is to provide a ramp generator which can exactly determine the lower limit or the upper limit of the sawtooth wave so as not to be affected by variation in the supply voltage.

In light of the above problems, the present invention has been designed. The ramp generator of the invention of a vertical deflection circuit for supplying a sawtooth wave current to a vertical deflection coil corresponding to a vertical pulse is characterized by comprising a waveform shaping circuit triggered corresponding to a vertical pulse and generating a pulse of a predetermined width, a constant current circuit for generating a constant current, a capacitor charged corresponding to a current from the constant current circuit, a control transistor for controlling charge and discharge of the capacitor corresponding to an output signal from the waveform shaping circuit, and a clamping circuit which, when the terminal voltage (VA) of the capacitor falls or rises to a predetermined voltage, prevents the voltage from falling or rising from the value, so that the predetermined voltage value varies corresponding to the supply voltage.

BRIEF DESCRIPTION OF THE DRAWINGS

FIG. 4 is a circuit diagram exemplary of the conventional ramp generator;
FIG. 5 is a waveform chart showing waveforms of the components of the circuit in FIG. 4;
FIG. 7 is a circuit diagram of a first embodiment of the invention;
FIGS. 8a–8d is a waveform chart of the components of the circuit in FIG. 7;
FIG. 9 is a view exemplary of the constant current circuit in FIG. 7.

DESCRIPTION OF THE PREFERRED EMBODIMENTS

Figure 1:
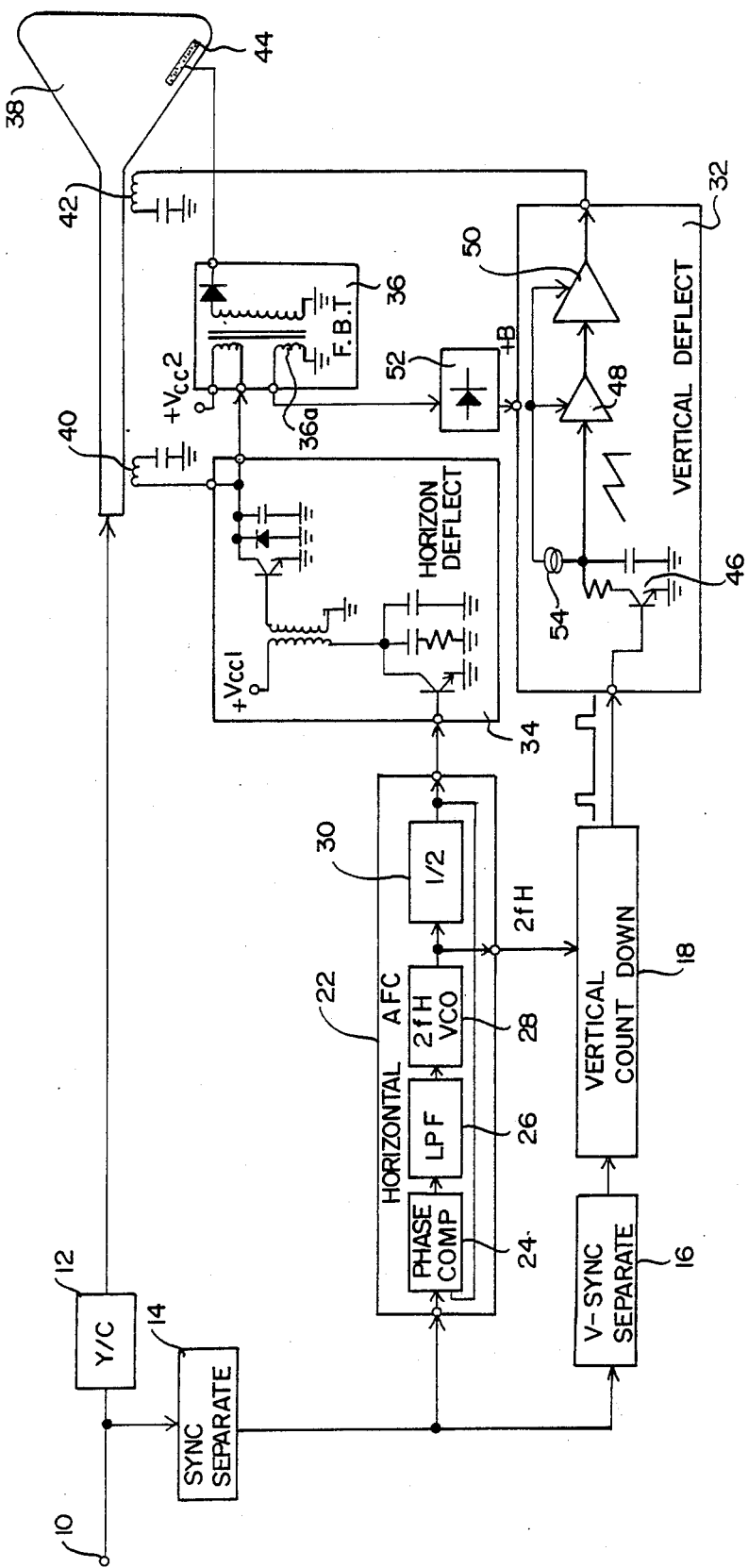
FIG. 1 is a schematic diagram of a television receiver.
Figure 2:
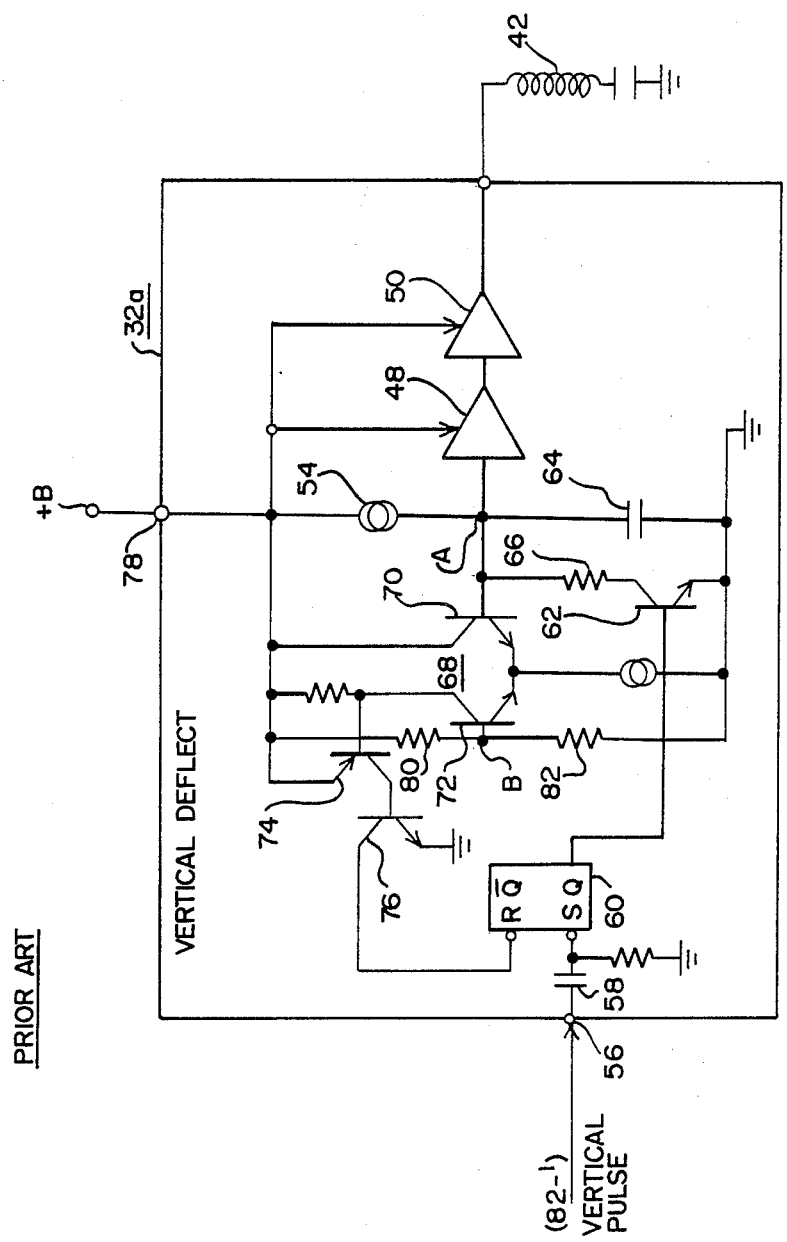
FIG. 2 is a circuit diagram showing the conventional vertical deflection circuit.
Figure 3A:
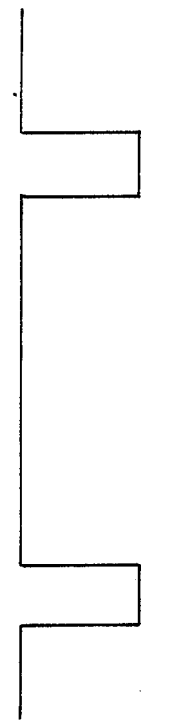
FIGS. 3a–3d shows waveforms of the components of the circuit in FIG. 2.
Figure 3B:
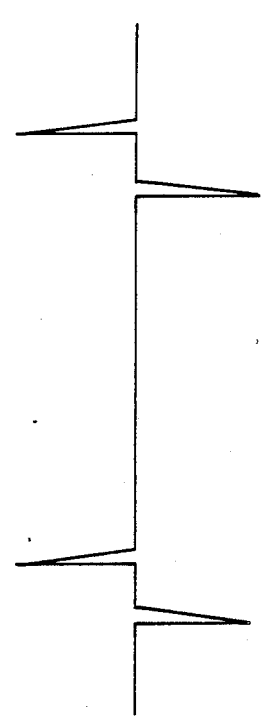
Figure 3C:
Figure 3D:
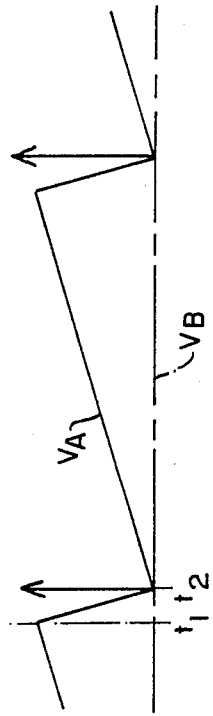
Figure 6:
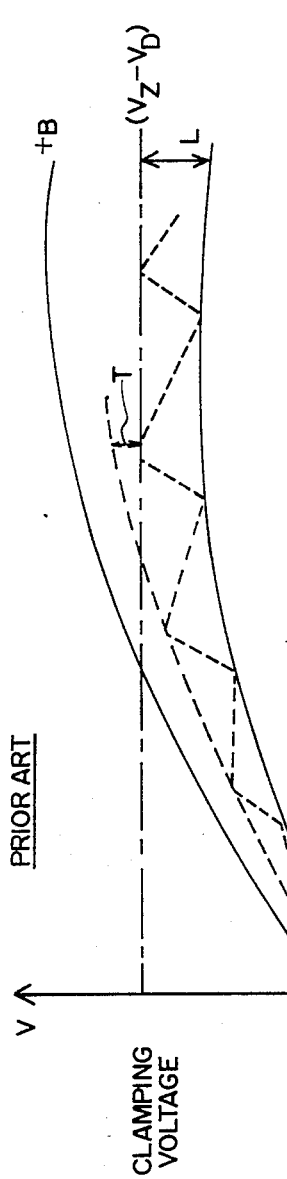
FIG. 6 is an illustration of operation of the circuit in FIG. 4 when the power source is closed.

In the present invention, a vertical pulse is waveform-shaped to be a pulse of constant width, and charge and discharge of the capacitor is controlled corresponding to said pulse.

When the terminal voltage falls or rises to the predetermined value corresponding to the discharge of the capacitor and the clamping circuit clamps the voltage to prevent the voltage from falling or rising more than the value, the clamping circuit is of a power source dependent type to be affected by variation in the supply voltage (+B), whereby the clamping operation can normally be performed even when the power source in on, or, the voltage varies.

FIG. 7 is a circuit diagram showing an embodiment of the present invention. In addition, in FIG. 7, circuit elements like those in FIGS. 1 through 4 are designated by like reference numerals and the description thereof is omitted.

(88) is a monomulti (monostable multivibrator) which waveform-shapes a vertical pulse from an input terminal (56).

(90) is a clamping transistor, the emitter of which is connected to node A, and the base to a power source terminal (78) through resistance (92).

(94) is a transistor operating as a level shift circuit.

(96) is a bias circuit for applying bias voltage to the transistor (94), the bias circuit (96) comprising resistances (96a) and (96b).

(102) is a clamping circuit comprising the bias circuit (96) and transistors (90) and (94).

(54) is a current source which varies output current following the variation in the supply voltage (+b) and which generates a constant current during a stationary state.

FIG. 8 shows the waveforms of the embodiment in FIG. 7. The vertical pulse in FIG. 8(a) is differentiated by a differentiating circuit (58) as shown in FIG. 8(b) and further waveform-shaped by a monostable multivibrator (88) as shown in FIG. 8(c). FIG. 8(d) shows a sawtooth wave generated at node A. When a capacitor (64) starts to discharge corresponding to the rising edge of the pulse at a time t1 in FIG. 8(c), its terminal voltage falls, but when it falls down to voltage VB, voltage VB is maintained. When the pulse falls at a time t2 in FIG. 8(c), a control transistor (62) in FIG. 7 is off, whereby the capacitor (64) is charged. Therefore, voltage at node A, as shown in FIG. 8(d), rises after time t2 corresponding to charge of the capacitor 64. When the next vertical pulse comes, the capacitor (64) again starts to discharge the same as mentioned above, and thereafter the same operation as the above is repeated. Accordingly, at node A, sawtooth waves clamped at the lower limit value to voltage VB and of constant amplitude as shown in FIG. 8(d) can be obtained.

Next an explanation will be given on the operation of the circuit. The vertical pulse (shown in FIG. 8(a)) from the input terminal (56) is applied as a trigger signal to the monostable multivibrator (88) through the differentiating circuit (58). The triggered monostable multivibrator (88) generates a pulse of a constant pulse width to turn on the control transistor (62). Upon turning on the control transistor (62), the capacitor (64), charged by the constant current circuit (54), starts to discharge.

At this time, (at t1, in FIG. 8), voltage at node A, the upper end voltage at the capacitor (64), becomes a sufficiently high value in comparison with voltage VB at node B of the bias circuit (96). Therefore, the emitter voltage of the clamping transistor (90) is sufficiently higher than that of transistor (94), the clamping transistor (90) being off.

Voltage at node A falls corresponding to the discharge of the capacitor (64), but when the voltage at node A falls down to voltage VB at node B, a clamping transistor (90) is on whereby voltage at node A is clamped to the voltage VB. The value of voltage VB is affected by variation in the supply voltage VB at a power source terminal (78), but a gain of the circuit constituting the clamping circuit is low so that the influence by the variation can be reduced.

The voltage VB generated at node B at the bias circuit (96) gets resistive division so as to follow the variation in the supply voltage (+B). A value of a current flowing through the constant current circuit (54) also follows the variation in the supply voltage (+B).

In other words, the constant current circuit (54) is constructed as shown in FIG. 9. When the power source is assumed to rise after being closed, the base voltage of a transistor (104) rises corresponding thereto and the collector current thereof increases. Then, a current flowing in an output terminal (108) at a current mirror circuit (106) which inverts the collector current, similarly increases. When the power source is stabilized and the base voltage at the transistor (104) becomes a predetermined value, a current of constant value flows in the output terminal (108).

Figure 10:
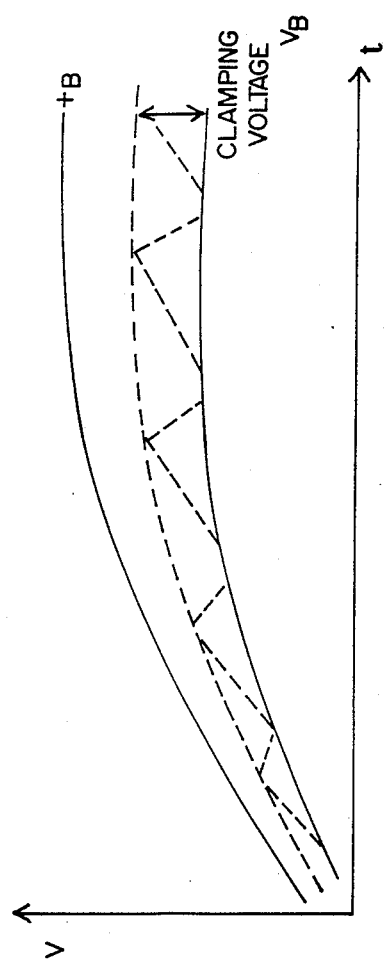
FIG. 10 is an illustration for operation of the circuit in FIG. 7 when the power source is closed.

Accordingly, even in the state where the supply voltage (+B) at the circuit in FIG. 7 gradually increases when the power source is on, as shown by the dotted line in FIG. 10, the sawtooth wave signal can always be clamped so that its amplitude gradually becomes larger, thereby enabling a good transient response to be performed. This is similar to a power source variation at a stationary state.

In addition, in the FIG. 7 embodiment, the lower end of the sawtooth wave is clamped, but the upper end may be clamped. The principle in this case will be shown in FIG. 11.

Figure 11:
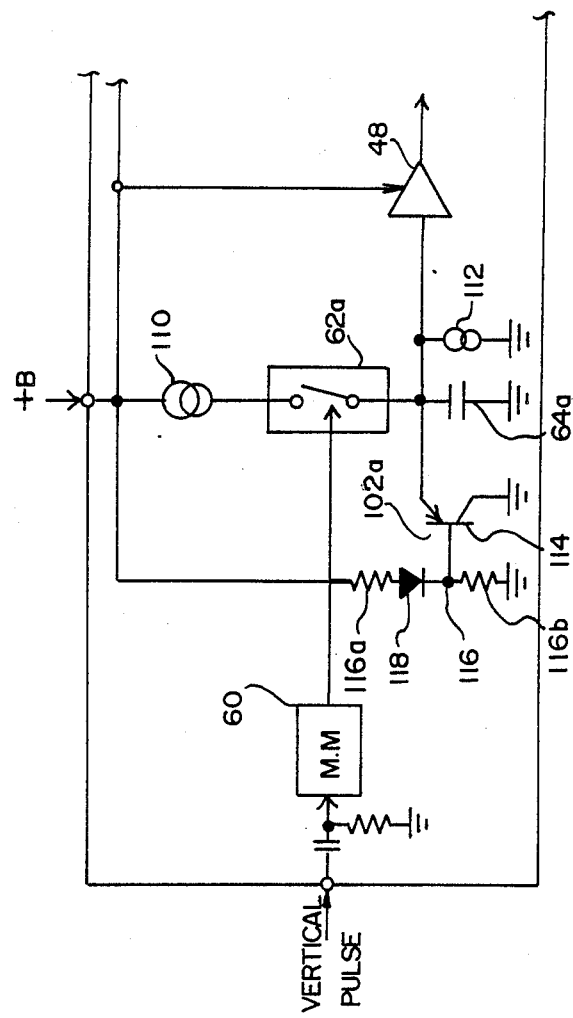
FIG. 11 is a circuit diagram of a second embodiment of the invention.

In FIG. 11, (116) is a bias circuit, (116a) and (116b) are resistances, (118) is a level shifting diode, (102a) is a clamping circuit, and (110) and (112) are constant current circuits.

A value of the constant current circuit (110) is set to be sufficiently larger than that of constant current circuit (112). Therefore, when a switch (62a) is closed corresponding to the control signal from the monostable multivibrator (60), the capacitor (64a) is charged by the constant current circuit (110). When voltage at node A rises up to more than the predetermined value, the transistor (114) is on and voltage at node A is clamped to the emitter voltage of transistor (114). Thereafter, when the switch (62a) is opened, the capacitor (64a) is discharged through the constant current circuit (112).

Accordingly, the circuit in FIG. 11 can clamp the upper end of the sawtooth wave signal.

Figure 12:
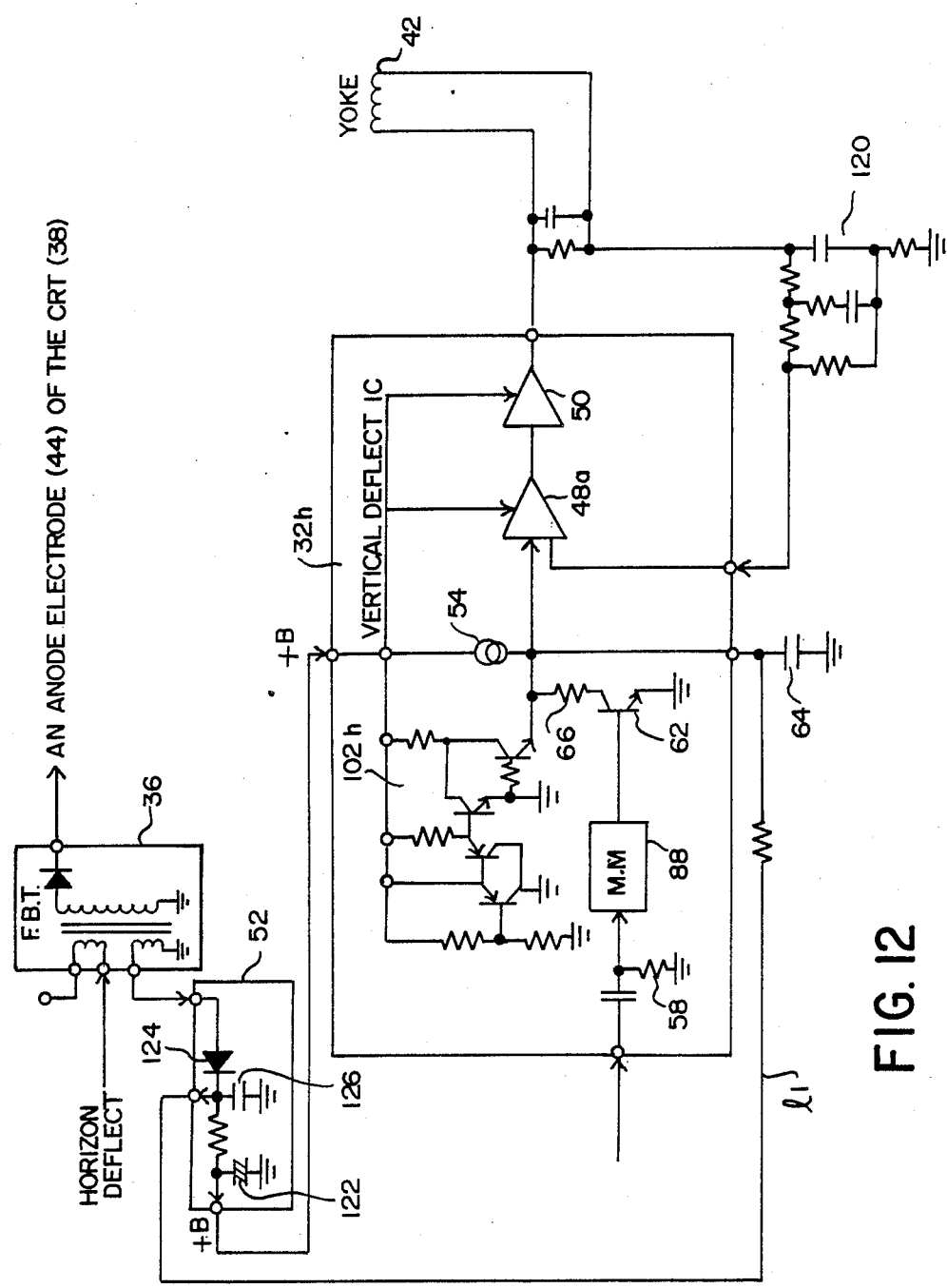
FIG. 12 is a circuit diagram of a third embodiment of the invention.

Referring to FIG. 12, a third embodiment of the present invention is shown, in which (102b) is a clamping circuit, (120) is a feedback circuit for correcting linearity (for S correction), (11) is a signal line for correcting the amplitude of sawtooth signal corresponding to instantaneous variation in anode voltage, and (122) is a capacitor for feeding stable supply voltage to a vertical deflection circuit 1C (34b). In addition, when the capacitor (122) increases its value, the vertical deflection circuit stably operates.

In this embodiment, when the amplitude of sawtooth wave signal is corrected in convention with an instantaneous variation in anode voltage, voltage rectified by a diode (124) and a capacitor (126) is connected to the charge/discharge capacitor (64) through the signal line (11), so that a charge amount of capacitor (64), when the anode voltage is high, is controlled to be larger in amplitude, and when the same is low, the amplitude is controlled to be smaller.

Thus, in the third embodiment, the rectifier circuit (52) has two outputs, one of which serves as the output for detecting gentle anode voltage variation and for supplying power to the vertical deflection circuit and the other is used for detecting steep variation in anode voltage.

As seen from the above, the present invention is provided with the waveform shaping circuit (88) for waveform shaping the vertical pulse so as to form a pulse of a constant pulse width, thereby enabling the scanning start timing to be constant regardless of the variation in the supply voltage.

In the present invention, reference voltage (VB) of clamping circuits (102), (102a) and (102b) vary following the supply voltage (+B), whereby, when the lower source is on, the amplitude of the sawtooth wave signal does not vary largely and not continuously when the power source is on.

In the present invention, the clamping circuits (102), (102a) and (102b), which operate clamping when terminal voltages of the capacitors (64) and (64a) are the predetermined values respectively, are adapted to output at a circuit of low gain, such as emitter followers (114), (90), (94) and (102b), whereby the lower limit or upper limit value of the sawtooth can accurately decide not to be affected by variation in supply voltage. As the result, the generating time and amplitude of a sawtooth wave can always be constant, whereby when the sawtooth wave is used for deflecting operation, a proper interlace characteristic is obtainable on the television picture plane.

What is claimed is:

1. A vertical ramp generator of a vertical deflection circuit for feeding a sawtooth wave current to a vertical deflection coil corresponding to a vertical pulse, said vertical ramp generator comprising:

a waveform shaping circuit triggered corresponding to said vertical pulse and generating a pulse of a predetermined width;

constant current circuit generating a constant current;

a capacitor charged corresponding to currents from said constant current circuit;

control transistor controlling charge and discharge of said capacitor corresponding to an output signal from said waveform shaping circuits; and a clamping circuit, wherein said clamping circuit comprises voltage dividing means for dividing a supply voltage by resistances, and a transistor, a base of said transistor is applied with output voltage from said voltage dividing means and an emitter of said transistor is connected to a terminal of said capacitor, wherein when terminal voltages of said capacitor fall or rise to a predetermined value, said clamping circuit prevents the terminal voltage from falling or rising from said predetermined value and said clamping circuit varies the predetermined voltage value of each of said circuits corresponding to a supply voltage.

2. A vertical ramp generator of a vertical deflection circuit for feeding a sawtooth wave current to a vertical deflection coil corresponding to a vertical pulse, said vertical ramp generator comprising:

a waveform shaping circuit triggered corresponding to said vertical pulse and generating a pulse of a predetermined width, wherein said waveform shaping circuit comprises a monostable vibrator;

constant current circuit generating a constant current;

a capacitor charged corresponding to currents from said constant current circuit;

control transistor controlling charge and discharge of said capacitor corresponding to an output signal from said waveform shaping circuits; and a clamping circuit, wherein said clamping circuit comprises voltage dividing means for dividing a supply voltage by resistances, and a transistor, a base of said transistor is applied with output voltage from said voltage dividing means and an emitter of said transistor is connected to a terminal of said capacitor, wherein when terminal voltages of said capacitor fall or rise to a predetermined value, said clamping circuit prevents the terminal voltage from falling or rising from said predetermined value and said clamping circuit varies the predetermined voltage value of each of said circuits corresponding to a supply voltage.

3. A vertical ramp generator of a vertical deflection circuit for feeding a sawtooth wave current to a vertical deflection coil corresponding to a vertical pulse, said vertical ramp generator comprising:

a waveform shaping circuit triggered corresponding to said vertical pulse and generating a pulse of a predetermined width, wherein said waveform shaping circuit comprises a monostable multivibrator, said monostable multivibrator generates an output signal smaller in pulse width than said vertical pulse;

constant current circuit generating a constant current;

a capacitor charged corresponding to currents from said constant current circuit;

control transistor controlling charge and discharge of said capacitor corresponding to an output signal from said waveform shaping circuits; and a clamping circuit, wherein said clamping circuit comprises voltage dividing means for dividing a supply voltage by resistances, and a transistor, a base of said transistor is applied with output voltage from said voltage dividing means and an emitter of said transistor is connected to a terminal of said capacitor, wherein when terminal voltages of said capacitor fall or rise to a predetermined value, said clamping circuit prevents the terminal voltage from falling or rising from said predetermined value and said clamping circuit varies the predetermined voltage value of each of said circuits corresponding to a supply voltage.

4. A vertical ramp generator of a vertical deflection circuit for feeding a sawtooth wave current to a vertical deflection coil corresponding to a vertical pulse, said vertical ramp generator comprising:

a waveform shaping circuit triggered corresponding to said vertical pulse and generating a pulse of a predetermined width;

constant current circuit generating a constant current, said constant current circuit changes an output current thereof following variations in a supply voltage;

a capacitor charged corresponding to currents from said constant current circuit;

control transistor controlling charge and discharge of said capacitor corresponding to an output signal from said waveform shaping circuits; and a clamping circuit, wherein said clamping circuit comprises voltage dividing means for dividing a supply voltage by resistances, and a transistor, the base of said transistor is applied with output voltage from said voltage dividing means and an emitter of said transistor is connected to a terminal of said capacitor, wherein when terminal voltages of said capacitor fall or rise to a predetermined value, said clamping circuit prevents the terminal voltage from falling or rising from said predetermined value and said clamping circuit varies the predetermined voltage value of each of said circuits corresponding to said supply voltage.

* * * * *